INVENTOR.
GOTTFRIED GRUNWALDT
BY
Frank R. Jeffries
AGENT

Aug. 3, 1965 G. GRUNWALDT 3,198,964

TRANSISTOR SWITCH HAVING A PLURALITY OF TRANSISTORS CONNECTED IN SERIES

Filed March 22, 1963 2 Sheets-Sheet 2

INVENTOR.
GOTTFRIED GRUNWALDT
BY
Frank R. Jerfani
AGENT

United States Patent Office 3,198,964

Patented Aug. 3, 1965

3,198,964

TRANSISTOR SWITCH HAVING A PLURALITY OF TRANSISTORS CONNECTED IN SERIES

Gottfried Grunwaldt, Hamburg, Germany, assignor to North American Philips Company, Inc., New York, N.Y., a corporation of Delaware Filed Mar. 22, 1963, Ser. No. 267,112
Claims priority, application Germany, Apr. 10, 1962, P 29,163
14 Claims. (Cl. 307—88.5)

This invention relates to a transistor switch employing a plurality of transistors connected in series and in which one of said series-connected transistors acts as a control transistor for switching voltages higher than the maximum permissible blocking voltage of any single transistor in the series-connected group.

It is often necessary to switch high voltages with the aid of transistors whereby the voltage to be switched exceeds the maximum permissible blocking voltage for a single transistor. It is therefore necessary that a plurality of transistors connected in series be used for solving the problem, however, it is also necessary to provide for equal distribution of the voltage to be switched across the switching path provided by the series-connected transistors. In fact, if an equal distribution cannot be maintained, an impermissible blocking voltage may occur across one or more of the individual transistors, resulting in deterioration of those transistors. It is thus necessary that equal distribution be maintained as far as possible not only in the rest condition, i.e., full "ON" or full "OFF," but also during switching. In addition to the above requirements, rapid switching is desirable for such transistorized switches, in order to minimize the energy dissipated in the transistors during switching.

The above enumerated difficulties encountered with transistor series connected switches are not eliminated by the use of known direct current voltage dividers as illustrated in British Patent No. 821,766, published October 14, 1959. They can only be overcome if, in accordance with the invention, a series-combination of transformer windings and capacitors inter-coupled with respect to alternating current, i.e., switching transients, is included between the collector of the first transistor and the emitter of the last transistor of the series connected transistors which acts as the control transistor; and the base electrode or electrodes of the series transistor or series transistors, except for that of the control transistor are connected to said series combination of transformer windings and capacitors as well as to the known direct current voltage divider.

A series connected transistor switch constructed according to the invention provides two advantages, namely rapid switching and substantially equal distribution of the blocking voltage over the series connected transistors in both the blocked condition and during switching.

In order that the invention may be readily carried into effect, it will now be described in detail, by way of example, with reference to the accompanying diagrammatic drawing, in which.

Figure 1:
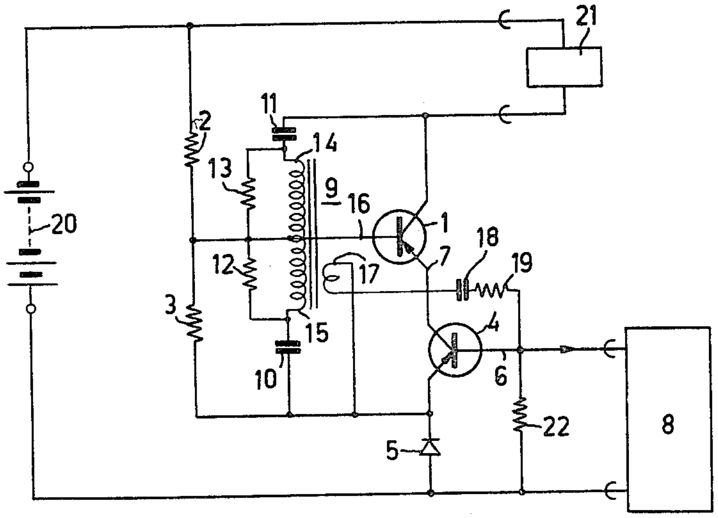
FIG. 1 shows the circuit diagram of a first embodiment of a novel transistor switch constructed according to the invention and having two transistors.

In the cut-off condition, the base voltage of a transistor 1 and hence the voltage distribution over the transistors are determined by the no-load voltage at the tapping of the direct current voltage divider comprising resistors 2 and 3. A control transistor 4 has a cut-off voltage across its base-emitter path due to the potential of its emitter being more negative than that of its base 6 by the voltage drop across a diode 5 in the pass direction.

The transistor switch is rendered conducting by feeding the base 6 of control transistor 4 with a negative current. The control transistor 4 then controls transistor 1 at its emitter 7. In the switched-on condition, the transistor 1 receives a base current via resistor 2 and the control transistor 4 receives a base current from a control-current source 8, shown diagrammatically. A dynamically operating equal distribution of the voltage, i.e., equal distribution of transient voltages, is obtained during switching by means of a circuit comprising a transformer 9, capacitors 10 and 11 and resistors 12 and 13. The numbers of turns of the windings 14, 15 of the transformer 9, as well as the resistors 12 and 13 are preferably identical for equal distribution of transient voltages. The circuit operates dynamically if the base 16 of the transistor 1 is fed, with the interposition of a capacity comprising the capacitors 10 and 11, with a constant voltage which is at any moment half the voltage across the switching path. A prerequisite therefore is good coupling between the windings 14 and 15 such as obtained, for example, by winding bifilarly. To prevent the transformer 9 and the capacitors 10 and 11 from carrying out damped oscillations, an aperiodic damping is brought about by means of the resistors 12 and 13. The latter may be omitted if the switching frequency is at any time higher than the resonance frequency of the circuit. The advantage of the circuit shown in FIG. 1 resides inter alia in that a direct capacitive loading of the switching path is avoided, which is a condition for rapid switching.

Additionally, in the circuit according to the invention, the switching operation is speeded up by a positive feedback from an auxliary winding 17 of transformer 9 to the base-emitter path of transistor 4 with the interposition of an R.C.-series-combination (18, 19). A reduction in switching time of, for example, about 40% is thus obtained. In the switched-on condition, a current flows from a current source 20 via the transistor switch through a consumer device 21, shown diagrammatically.

The component values for a circuit constructed as shown in FIG. 1 which has been found satisfactory in practice are given below:

| | |
|---|---|
| Voltage of the current source 20 | 70 to 86 volts. |
| Transistors 1 and 4 | OC 28, consumer current up to 3 amps. |
| Resistors 2 and 3 | 525 ohms. |
| Resistors 12 and 13 | 470 ohms. |
| Resistor 19 | 10 ohms. |
| Base resistor 22 | 82 ohms. |
| Capacitors 11 and 12 | 0.5 μf. |
| Capacitor 18 | 0.68 μf. |

The transformer comprises an EI type core 30 without air-gap with 2×230 turns for the windings 14 and 15 and 18 turns for the auxiliary winding 17. The diameter of the wire is 0.23 mm.

In many cases it is adequate or advantageous for the voltage distribution over the transistors to be chosen in a ratio other than 1:1. This is the case if the above voltage to be switched can be withstood by a transistor having a high voltage breakdown associated with one having a low voltage breakdown. If, for example, the transistor 1 and the control transistor 4 have to take up the portions $U_1$ and $U_2$ respectively of the voltage across the switching path, the proportioning of the circuit for the voltage distribution must fulfill the following equations:

$$\frac{\text{Resistor 2}}{\text{Resistor 3}}=\frac{\text{Number of turns of winding 14}}{\text{Number of turns of winding 15}}=\frac{U_1}{U_2}$$

$$\frac{\text{Capacity of capacitor 10}}{\text{Capacity of capacitor 11}}=\left(\frac{U_1}{U_2}\right)^2$$

This method of obtaining an arbitrary distribution of voltage is also advantageous in transistor switches of the type having more than two transistors connected in series. In this case, the base of each of the series transistors following the control transistor is connected to its own voltage distribution circuit, as shown in FIG. 1. However, the windings (14 and 15) for each transistor can be provided on the same transformer 9.

Figure 2:
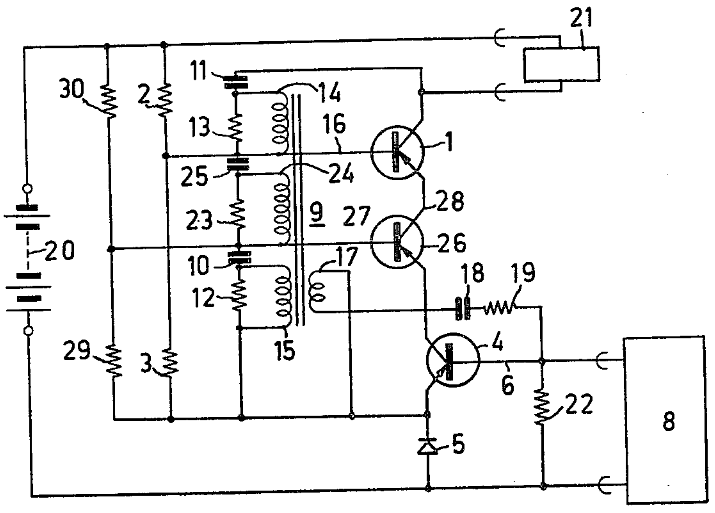
FIG. 2 shows the circuit diagram of a second novel embodiment of said transistor switch having three transistors.

One embodiment of a transistor switch having 3 transistors is shown in FIG. 2. Elements corresponding to FIG. 1 are provided with the same reference numerals. The distribution circuit comprises a continuous series-combination of capacitors and transformer windings damped by resistors, such as shown in FIG. 1.

Said circuit comprises, in addition to the circuit elements of FIG. 1, a further series-transistor 26 having a base 27 and a collector 28. Between the base 16 of transistor 1 and the base 27 of transistor 26 there is included a winding 24 provided on transformer 9 together with an ohmic resistor 23 connected in parallel and a capacitor 25 connected in series. The base 27 of transistor 26 receives its bias through the voltage divider comprising ohmic resistors 29 and 30. If the voltage of the switching path is divided equally the electrical values of the capacitors 10, 11, 25 and of the resistors 12, 13, 23, as well as the numbers of turns of the windings 14, 15, 24 must be the same. All the windings are provided on the same transformer and must be properly coupled together.

Figure 3:
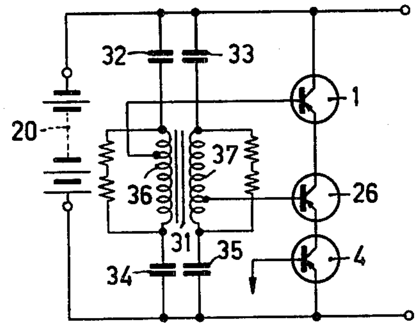
FIG. 3 shows a variant of the transistor switch illustrated in FIG. 1.

As shown in FIG. 3, the series combination intercoupled with respect to alternating current may alternatively be obtained with a transformer 31 having windings 36 and 37 which are connected in parallel with the switching path 5 of the transistors 1, 26, 4 through capacitors 32, 33 and 34, 35, respectively.

What is claimed is:

1. A transistor switch for switching voltages exceeding the maximum permissible blocking voltage of an individual transistor comprising: *n* transistors where *n* is an integer greater than one each having control, common and output electrodes, means connecting the common-output electrode path of the transistors in series with each other and with a load circuit and said series connected common-output electrode paths and load circuit across a voltage source, ($n$—1) voltage dividers connected across said voltage source each having a tap at a different preselected voltage, means connecting the control electrodes of all but the first transistor each to a different voltage tap such that the static open switch voltage between successive control electrodes in the series circuit does not exceed the maximum permissible blocking voltage for each transistor, *n* close coupled inductive windings, *n* capacitors, means connecting one winding and one capacitor in series to form *n* series connected inductive capacitive circuits, means connecting the inductive-capacitive circuits in series between the output electrode of the last transistor in the series connected circuit and the common electrode of the first transistor, means connecting the control electrodes of all but the first transistor each to a different inductive-capacitive circuit, and means including a control current source connected to the control electrode of said first transistor for selectively controlling the conduction state of said first and subsequent transistors to selectively provide a conductive path between the load circuit and the voltage source.

2. A transistor switch as set forth in claim 1, in which the *n* close coupled windings each have the same number of turns and the *n* capacitors are substantially identical to provide substantially equal voltage distribution across each of the series connected transistors at all times.

3. A transistor switch as set forth in claim 1, in which each winding is shunted by a damping resistor.

4. A transistor switch as set forth in claim 2, in which each winding is shunted by a damping resistor and all of which have the same value.

5. A transistor switch for switching voltages exceeding the maximum permissible blocking voltage of an individual transistor comprising: first and second transistors each having common, control and output electrodes, means connecting the common-output electrode paths in series with each other and with a load to form a first series circuit, means connecting said first series circuit across a voltage source having a magnitude exceeding the maximum permissible blocking voltage of either said first and second transistor but less than the sum of the said blocking voltages, a voltage divider connected across said voltage source including a tap at a preselected voltage which does not exceed the maximum permissible blocking voltage for the second transistor, means connecting the control electrode of the second transistor to the tap, first and second close coupled inductive windings, first and second capacitors, means connecting said first and second windings and said first and second capacitors, respectively, in series to form first and second series inductive-capacitive circuits, respectively, means connecting the first and second inductive-capacitive circuits in series between the common electrode of the first transistor and the output electrode of the second transistor, respectively, means connecting the control electrode of the second transistor to the common junction of the first and second inductive-capacitive circuits, and means including a control current source connected to the control electrode of the first transistor for selectively controlling the conduction state of said first and second transistors to selectively provide a conductive path between the load circuit and the voltage source.

6. A transistor switch as set forth in claim 5, in which the first and second close coupled inductive windings each have the same number of turns and the first and second capacitors have substantially the same value to provide substantially equal voltage distribution across the first and second transistors at all times.

7. A transistor switch as set forth in claim 5, in which the first and second windings are each shunted by a damping resistor.

8. A transistor switch as set forth in claim 6, in which the first and second windings are each shunted by a damping resistor of the same predetermined value.

9. A transistor switch for switching voltages exceeding the maximum permissible blocking voltage of an individual transistor comprising: first, second and third transistors each having common, control and output electrodes, means connecting the common-output electrode paths in series with each other and with a load to form a first series circuit, means connecting said first series circuit across a voltage source having a magnitude exceeding the sum of the maximum permissible blocking voltage of two of said transistors but less than the sum of all three, a first and second voltage divider connected across said voltage source each including a voltage tap in which the voltage drop between one side of the source and the tap on the first divider does not exceed the maximum permissible blocking voltage of the first transistor and the voltage drop between the taps does not exceed the maximum permissible blocking voltage of the second transistor, means connecting the control electrode of the first transistor to the tap on the first voltage divider and the control electrode of the second transistor to the tap on the second voltage divider, first, second and third close coupled inductive windings, first, second and third capacitors, means connecting said first, second and third windings and said first, second and third capacitors, respectively, in series to form first, second and third (inductive capacitive) circuits, respectively, means connecting the first, second and third (inductive capacitive) circuits in series between the output electrode of the first transistor and the common electrode of the third transistor, respectively, means connecting the control electrodes of the first and second transistors to the common junction of the first and second, and second and third (inductive capacitive) circuits, respectively, and means including a control current source connected to the control electrode of the third transistor for selectively controlling the conductive state of said first, second and third transistors to selectively provide a conductive path between the load circuit and the voltage source.

10. A transistor switch as set forth in claim 9, in which the first, second and third close coupled inductive windings each have the same number of turns and the first, second and third capacitors have substantially the same value to provide a substantially equal voltage distribution across the series connected transistor at all times.

11. A transistor switch as set forth in claim 9, in which the first, second and third windings are each shunted by a damping resistor.

12. A transistor as set forth in claim 10, in which the first, second and third windings are each shunted by a damping resistor of the same predetermined value.

13. A transistor switch for switching voltages exceeding the maximum permissible blocking voltage of an individual transistor where *n* is an integer greater than one comprising: *n* transistors each having control, common and output electrodes, means connecting the common-output electrode path of the transistors in series with each other and with a load circuit and said series connected common-output electrode paths and load circuit across a voltage source, a voltage divider means connected across said voltage source providing *n*—1 taps each at a different preselected voltage, means connecting the control electrodes of all but the first transistor each to a different voltage tap such that the static open switch voltage between successive control electrodes in the series circuit does not exceed the maximum permissible blocking voltage for each transistor, *n* close coupled inductive windings, *n* capacitors, means connecting one winding and one capacitor in series to form *n* series connected (inductive capacitive) circuits, means connecting the (inductive capacitive) circuits in series between the output electrode of the last transistor in the series connected circuit and the common elecrode of the first transistor, means connecting the control electrodes of all but the first transistor each to a different (inductive capacitive) circuit, and means including a control current source connected to the control electrode of said first transistor for selectively controlling the conduction state of said first and subsequent transistors to selectively provide a conductive path between the load circuit and the voltage source.

14. A transistor switch as set forth in claim 13 in which an auxiliary winding is close coupled to the said close coupled inductive windings and is electrically connected in the common control electrode circuit of the first transistor to supply regenerative feedback for speeding up the switching.

References Cited by the Examiner

UNITED STATES PATENTS 3,095,510 6/63 Lane ---------------- 307—88.5

FOREIGN PATENTS 821,766 10/59 Great Britain.

ARTHUR GAUSS, *Primary Examiner.*

UNITED STATES PATENT OFFICE

CERTIFICATE OF CORRECTION

Patent No. 3,198,964 August 3, 196

Gottfried Grunwaldt

It is hereby certified that error appears in the above numbered patent requiring correction and that the said Letters Patent should read as corrected below.

Column 3, line 3, strike out "above"; line 9, for "the voltage" read -- the above voltage --; column 5, line 40, strike out "where n is an integer greater than one"; line 41, for "n transistors each" read -- n transistors where n is an integer greater than one each --.

Signed and sealed this 19th day of July 1966.

(SEAL)
Attest:

ERNEST W. SWIDER
Attesting Officer

EDWARD J. BRENNER
Commissioner of Patents